(12) United States Patent
Ju et al.

(10) Patent No.: US 9,490,647 B2
(45) Date of Patent: Nov. 8, 2016

(54) CAPACITANCE DISCHARGE LIMITER

(71) Applicant: PEREGRINE SEMICONDUCTOR CORPORATION, San Diego, CA (US)

(72) Inventors: Hojung Ju, San Diego, CA (US); Jianhua Lu, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 244 days.

(21) Appl. No.: 14/309,312

(22) Filed: Jun. 19, 2014

(65) Prior Publication Data
US 2015/0372525 A1    Dec. 24, 2015

(51) Int. Cl.
*H02J 7/00* (2006.01)
*H02M 3/06* (2006.01)
*H02M 7/5383* (2007.01)
*H03G 7/00* (2006.01)
(Continued)

(52) U.S. Cl.
CPC ............ *H02J 7/0072* (2013.01); *H03G 7/004* (2013.01); *H03G 7/06* (2013.01); *H03G 11/00* (2013.01); *H02J 7/345* (2013.01); *H02M 3/06* (2013.01); *H02M 7/5383* (2013.01); *H03J 2200/10* (2013.01); *Y10T 29/49105* (2015.01)

(58) Field of Classification Search
CPC ...... H02J 7/0072; H02J 7/345; H03G 7/004; H03G 7/06; H03G 11/00; Y10T 29/49105; H03J 2200/10; H02M 3/06; H02M 7/5383
USPC .............................. 320/166; 363/74; 307/109
See application file for complete search history.

(56) References Cited

U.S. PATENT DOCUMENTS 3,898,410 A * 8/1975 Peters, Jr. ............... H02M 5/45
                                                          219/622
3,987,356 A * 10/1976 Steigerwald .......... H02M 3/137
                                                          307/109
(Continued)

FOREIGN PATENT DOCUMENTS

| JP | 2001209441 A | * | 8/2001 |
| JP | 2013228244 A | * | 11/2013 |
| WO | 2009108391 | | 9/2009 |

OTHER PUBLICATIONS

Drozdovski, Nikolai, "Microwave Passive Power Limiters Based on MESFETs", Journal of Microwaves and Optoelectronics, vol. 1, No. 2, Apr. 1998, pp. 26-36.

(Continued)

*Primary Examiner* — Phallaka Kik
(74) *Attorney, Agent, or Firm* — Jaquez Land Greenhaus LLP; Martin J. Jaquez, Esq.; John Land, Esq.

(57) ABSTRACT

A capacitance discharge limiter in which a DC transition protection circuit is provided in a circuit that includes a discharge circuit (which may be a power limiter) between a source and a receiver, with a capacitor situated between the source and the discharge circuit. The DC transition protection circuit is coupled to a reference voltage and to the control voltage input of the discharge circuit, and also between the capacitor and the discharge circuit at a node. The DC transition protection circuit detects the existence of an excess DC or low frequency (typically less than about 1 MHz) voltage potential at the node caused by charge on the capacitor, and regulates the control voltage so as to enable the discharge circuit to discharge the capacitor to protect the receiver.

6 Claims, 9 Drawing Sheets

(51) Int. Cl.
*H03G 7/06* (2006.01)
*H03G 11/00* (2006.01)
*H02J 7/34* (2006.01)

(56) References Cited

U.S. PATENT DOCUMENTS

| | | | |
|---|---|---|---|
| 5,642,267 A * | 6/1997 | Brkovic | G05F 1/613 |
| | | | 323/224 |
| 5,646,833 A | 7/1997 | Gaudreau et al. | |
| 6,201,714 B1 * | 3/2001 | Liang | H02M 3/33576 |
| | | | 323/268 |
| 6,215,634 B1 | 4/2001 | Terasawa | |
| 6,229,355 B1 | 5/2001 | Ogasawara | |
| 6,489,755 B1 * | 12/2002 | Boudreaux, Jr. | H02M 1/15 |
| | | | 323/282 |
| 7,170,135 B2 | 1/2007 | Zecri et al. | |
| 7,482,930 B2 | 1/2009 | Song et al. | |
| 7,719,343 B2 | 5/2010 | Burgener et al. | |
| 7,910,993 B2 | 3/2011 | Brindle et al. | |
| 8,129,787 B2 | 3/2012 | Brindle et al. | |
| 8,320,091 B2 | 11/2012 | Salcedo et al. | |
| 8,405,147 B2 | 3/2013 | Brindle et al. | |
| 8,928,388 B2 | 1/2015 | Lu et al. | |
| 2003/0021131 A1 * | 1/2003 | Nadot | H02M 1/34 |
| | | | 363/55 |
| 2004/0090807 A1 * | 5/2004 | Youm | H02M 7/5387 |
| | | | 363/132 |
| 2005/0023995 A1 * | 2/2005 | Ohnishi | H05B 41/3925 |
| | | | 315/291 |
| 2005/0248295 A1 * | 11/2005 | Chiou | H05B 41/28 |
| | | | 315/247 |
| 2006/0244393 A1 * | 11/2006 | Zane | H05B 41/2827 |
| | | | 315/209 M |
| 2009/0296431 A1 * | 12/2009 | Borisov | H02M 7/103 |
| | | | 363/62 |
| 2011/0031939 A1 * | 2/2011 | Funaba | B60K 6/445 |
| | | | 320/166 |
| 2011/0043271 A1 | 2/2011 | Ranta et al. | |
| 2011/0058392 A1 * | 3/2011 | Lee | H02M 3/33569 |
| | | | 363/16 |
| 2011/0069513 A1 * | 3/2011 | Lee | H02M 3/33569 |
| | | | 363/16 |
| 2011/0156819 A1 | 6/2011 | Kim et al. | |
| 2011/0241424 A1 * | 10/2011 | Fan | H02M 3/33561 |
| | | | 307/31 |
| 2012/0038344 A1 | 2/2012 | Kim et al. | |
| 2012/0248946 A1 * | 10/2012 | Shaver | H02K 11/20 |
| | | | 310/68 B |
| 2012/0267719 A1 | 10/2012 | Brindle et al. | |
| 2014/0266383 A1 | 9/2014 | Lu et al. | |

OTHER PUBLICATIONS

Wells, Kenneth B., Office Action received from the USPTO dated Apr. 30, 2014 for related U.S. Appl. No. 13/841,490, 20 pgs.
Lu, et al., Response filed in the USPTO dated Jul. 40, 2014 for related U.S. Appl. No. 13/841,490, 24 pgs.
Wells, Kenneth B., Notice of Allowance received from the USPTO dated Sep. 3, 2014 for related U.S. Appl. No. 13/841,490, 8 pgs.
Lu, et al., Comments on Examiner's Statement of Reasons for Allowance filed in the USPTO dated Dec. 3, 2014 for U.S. Appl. No. 13/841,490, 3 pgs.

* cited by examiner

CAPACITANCE DISCHARGE LIMITER

CROSS-REFERENCE TO RELATED APPLICATIONS

This application is related to U.S. patent application Ser. No. 13/841,490, filed Mar. 15, 2013, entitled "Self-Activating Adjustable Power Limiter" and assigned to the assignee of the present application, the entire content of which is hereby incorporated by reference.

BACKGROUND (1) Technical Field

This invention relates to electronic circuitry, and more particularly to a limiter circuit with capacitor discharging capability.

(2) Background

Limiter circuits are used in electronic systems to limit power, voltage, or current to protect electrically connected "downstream" electronic devices from being damaged by excessive output (e.g., power, voltage, or current) from an "upstream" source, which may be a power source, signal source, antenna, device being tested, etc. For example, FIG. 1 is a block diagram of a prior art limiter 100 electrically connected to limit the electrical output from a source 102 delivered to a receiver 104 so as not to exceed a set output level. At normal signal levels, the output of the limiter 100 linearly tracks the input from the source 102. However, at a designed threshold signal point determined by a control voltage Vctrl, the output of the limiter 100 is significantly curtailed as the input value increases above the threshold signal point.

A number of different circuit configurations have been used as limiters, as described in U.S. patent application Ser. No. 13/841,490 cited above, which teaches a self-activating adjustable power limiter as well as describing several prior art limiters. One characteristic of such limiters is that they are reasonable well adapted to limiting "upstream" device voltage excursions having frequencies above about 1 MHz, but do not work well with voltage excursions from DC (direct current) to about 1 MHz, and in particular, from DC to about 9 KHz.

This aspect of prior limiters is particularly problematic if there is effectively a capacitor 106 between the source 102 and the power limiter 100, as shown in FIG. 1. Such a capacitor may be a planned part of the circuit design or may constitute parasitic capacitance in the circuitry. With such a configuration, if the signal from the source 102 rapidly transitions from one voltage level to another (for example, because of a sudden change in power of a received RF signal), the capacitor 106 is suddenly charged to a DC potential that may damage the receiver 104 and/or the power limiter 100 itself as the accumulated charge across the capacitor 106 discharges, as shown in the time (x-axis) versus voltage (y-axis) curve 106a. Prior limiters have not been able react fast enough to limit such sudden transitory events in the DC to about 1 MHz frequency range, and in particular, from the DC to about 9 KHz frequency range.

Accordingly, there is a need for a limiter with capacitor discharging capability that rapidly detects and discharges sudden voltage excursions of a source device. The present invention provides such a limiter.

SUMMARY OF THE INVENTION

A capacitance discharge limiter that includes a DC transition protection circuit in a circuit including a discharge circuit (which may be a power limiter) between a source and a receiver, with a capacitor situated between the source and the discharge circuit. The DC transition protection circuit is coupled to a reference voltage and to the control voltage input of the discharge circuit, and also between the capacitor and the discharge circuit at a node. The DC transition protection circuit detects the existence of an excess DC or low frequency (typically less than about 1 MHz, including in particular from DC to about 9 KHz) voltage potential at the node caused by charge on the capacitor, and regulates the control voltage so as to enable the discharge circuit to discharge the capacitor to protect the receiver.

More particularly, in a power limiter configuration, a capacitor discharge event at the node will be sensed by the DC transition protection circuit. In an embodiment, the DC transition protection circuit will generate a transient control voltage Vctrl for the power limiter that is higher than the normal control voltage Vref for the power limiter. The transient control voltage forces the power limiter to a low impedance mode, which discharges the capacitor to circuit ground in a very short period of time. Consequently, the transient voltage from the capacitor will be suppressed in both magnitude and duration, thereby protecting the receiver. Otherwise, the power limiter handles limiting functions in a normal fashion when there is no capacitor potential to be discharged. As will be readily apparent to one of ordinary skill in the art, the DC transition protection circuit may be adapted for use with other types of power limiters.

One embodiment of the DC transition protection circuit includes circuitry that filters an input signal from the capacitor to pass only DC and low frequencies (typically less than about 1 MHz, including in particular from DC to about 9 KHz); a peak detector for detecting peak values of the filtered input signal; a comparator for comparing the detected peak values of the filtered input signal against a reference voltage to generate a discharge circuit control signal; and a discharge circuit coupled to the input signal and circuit ground and controlled by the discharge circuit control signal, which activates the discharge circuit and thereby discharges the capacitor.

Another embodiment of the DC transition protection circuit includes circuitry that filters an input signal from the capacitor to pass only DC and low frequencies (typically less than about 1 MHz, including in particular from DC to about 9 KHz); a peak detector for detecting peak values of the filtered input signal and generating a discharge circuit control signal in response to such detection; and a discharge circuit coupled to the input signal and circuit ground and controlled by the discharge circuit control signal, which activates the discharge circuit and thereby discharges the capacitor.

Each of the above embodiments may include further circuitry, such as a voltage level shifter and/or signal switch to selectively connect either a reference voltage or a generated control voltage derived from the input signal.

Another aspect of the invention includes a method for rapidly detecting and discharging undesired capacitor charge, including the steps of:

STEP 1: filtering an input signal from a capacitor to pass only DC and low frequency voltages (typically less than about 1 MHz, including in particular from DC to about 9 KHz);

STEP 2: detecting peak values of the filtered input signal;

STEP 3: comparing the detected peak values of the filtered input signal against a reference voltage to generate a discharge circuit control signal; and STEP 4: applying the discharge circuit control signal to a discharge circuit (which may be a power limiter) coupled to the input signal and circuit ground, thereby activating the discharge circuit and discharging the capacitor.

Yet another aspect of the invention includes a method for rapidly detecting and discharging undesired capacitor charge, including the steps of:

STEP 1: filtering an input signal from a capacitor to pass only DC and low frequency voltages (typically less than about 1 MHz, including in particular from DC to about 9 KHz);

STEP 2: detecting peak values of the filtered input signal and generating a discharge circuit control signal in response to such detection; and STEP 3: applying the discharge circuit control signal to a discharge circuit (which may be a power limiter) coupled to the input signal and circuit ground, thereby activating the discharge circuit and discharging the capacitor.

Both of the above methods may include further steps, such as providing for voltage level shifting and a signal switching to selectively connect either a reference voltage or a generated control voltage derived from the input signal.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 10 B is a graph of time (x-axis) versus voltage (y-axis) showing the Vctrl signal generated by the capacitance discharge limiter embodiment shown in FIG. 5 for the same test conditions applicable to FIG. 10A.

Like reference numbers and designations in the various drawings indicate like elements.

DETAILED DESCRIPTION OF THE INVENTION

Figure 1:
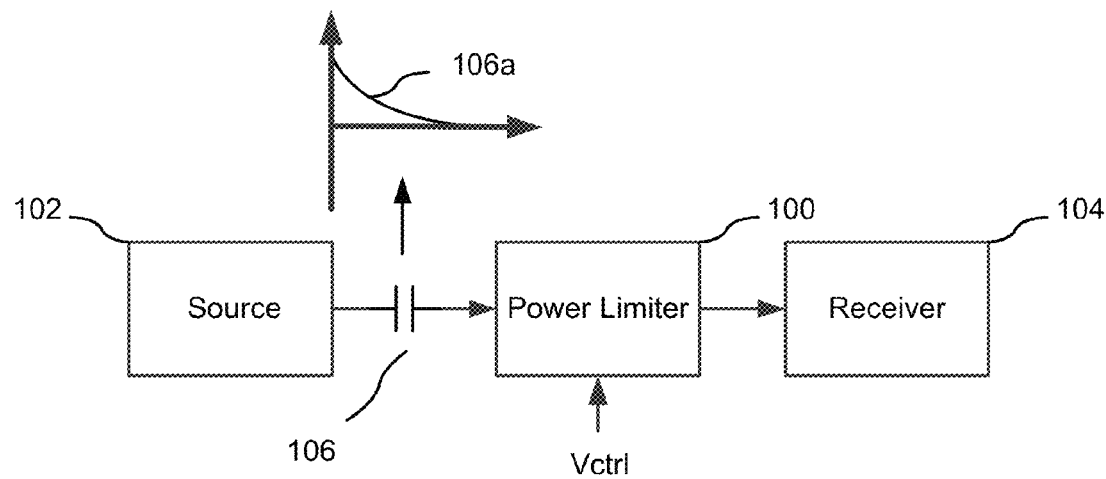
FIG. 1 is a block diagram of a prior art limiter electrically connected to limit the electrical output from a source delivered to a receiver so as not to exceed a set output level.
Figure 2:
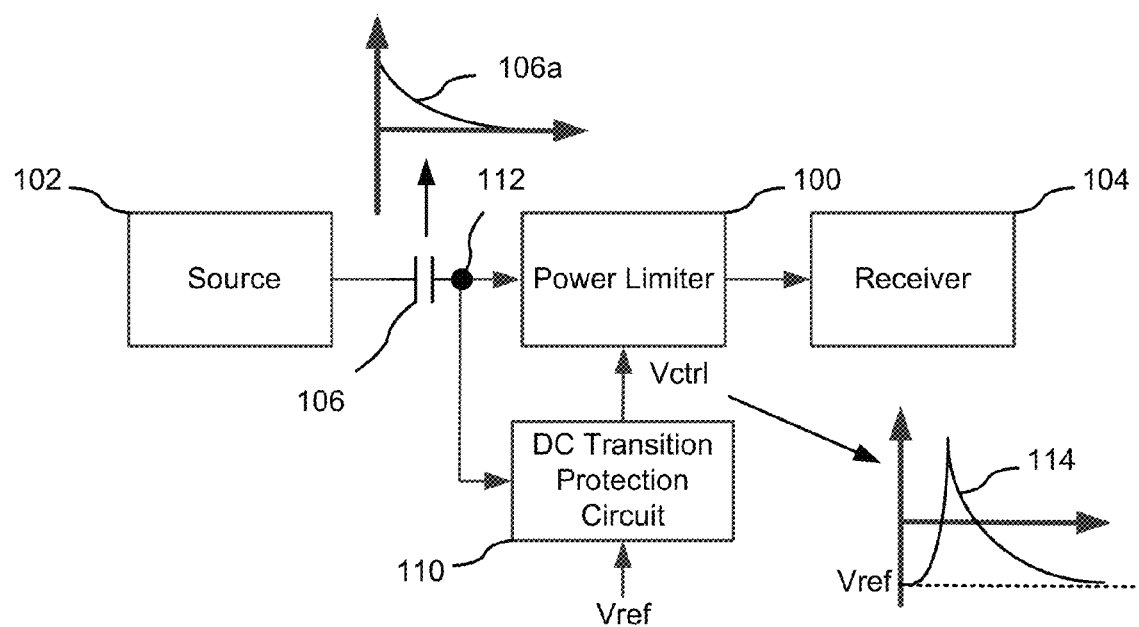
FIG. 2 is a block diagram of a capacitance discharge limiter in accordance with the present invention.

FIG. 2 is a block diagram of a capacitance discharge limiter in accordance with the present invention. As in FIG. 1, shown are a power limiter 100 between a source 102 and a receiver 104, with a capacitor 106 situated between the source 102 and the power limiter 100. In the illustrated embodiment, by way of example only, the power limiter is a "shunt to ground" circuit of the type described in U.S. patent application Ser. No. 13/841,490 cited above.

Also included in FIG. 2 is a DC transition protection circuit 110, which is coupled to a reference voltage Vref and to the control voltage (Vctrl) input of the power limiter 100, and also between the capacitor 106 and the power limiter 100 at a node 112. The DC transition protection circuit 110 detects the existence of an excess DC or low frequency voltage potential at the node 112 caused by charge on the capacitor 106, and regulates Vctrl so as to enable the power limiter 100 to discharge the capacitor 106 to protect the receiver 104.

Figure 8:
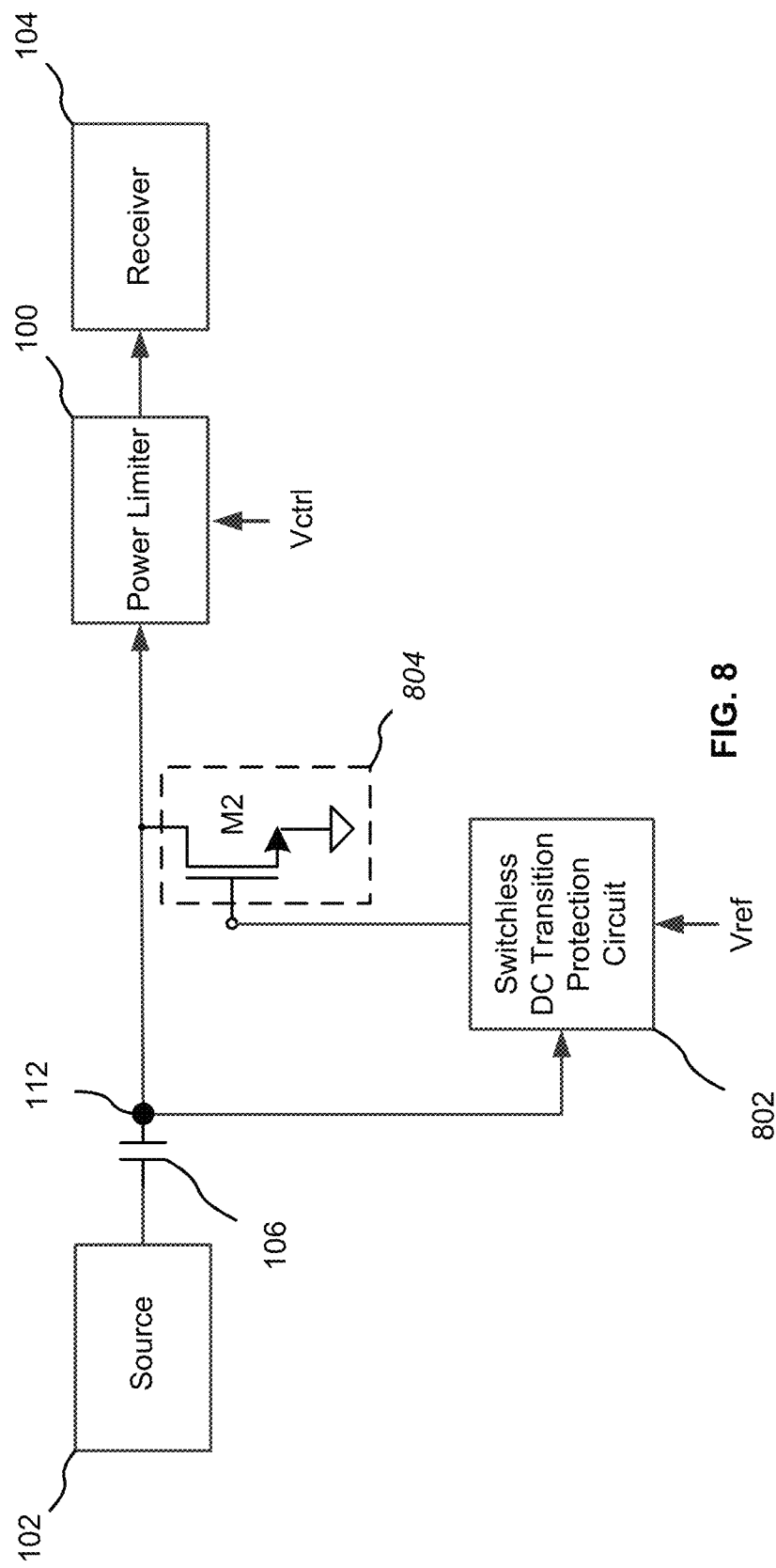
FIG. 8 is a block diagram of a capacitance discharge limiter embodying a switchless DC transition protection circuit.

More particularly, a capacitor discharge event at node 112 will be sensed by the DC transition protection circuit 110. In the illustrated embodiment, the DC transition protection circuit 110 will generate a transient control voltage Vctrl for the power limiter 100 that is higher than the normal control voltage Vref (the dotted line in FIG. 2) for the power limiter 100, as shown in the time (x-axis) versus voltage (y-axis) curve 114. In the illustrated embodiment, the transient control voltage Vctrl forces the power limiter 100 to a low impedance mode, which discharges the capacitor 106 to circuit ground in a very short period of time. Consequently, the transient voltage from the capacitor 106 will be suppressed in both magnitude and duration, thereby protecting the receiver 104. Otherwise, the power limiter 100 handles limiting functions in a normal fashion when there is no capacitor potential to be discharged. As will be readily apparent to one of ordinary skill in the art, the DC transition protection circuit 110 may be adapted for use with other types of power limiters 100 (see also the discussion below regarding FIG. 8, showing a "standalone" implementation of the DC transition protection circuit).

Figure 3:
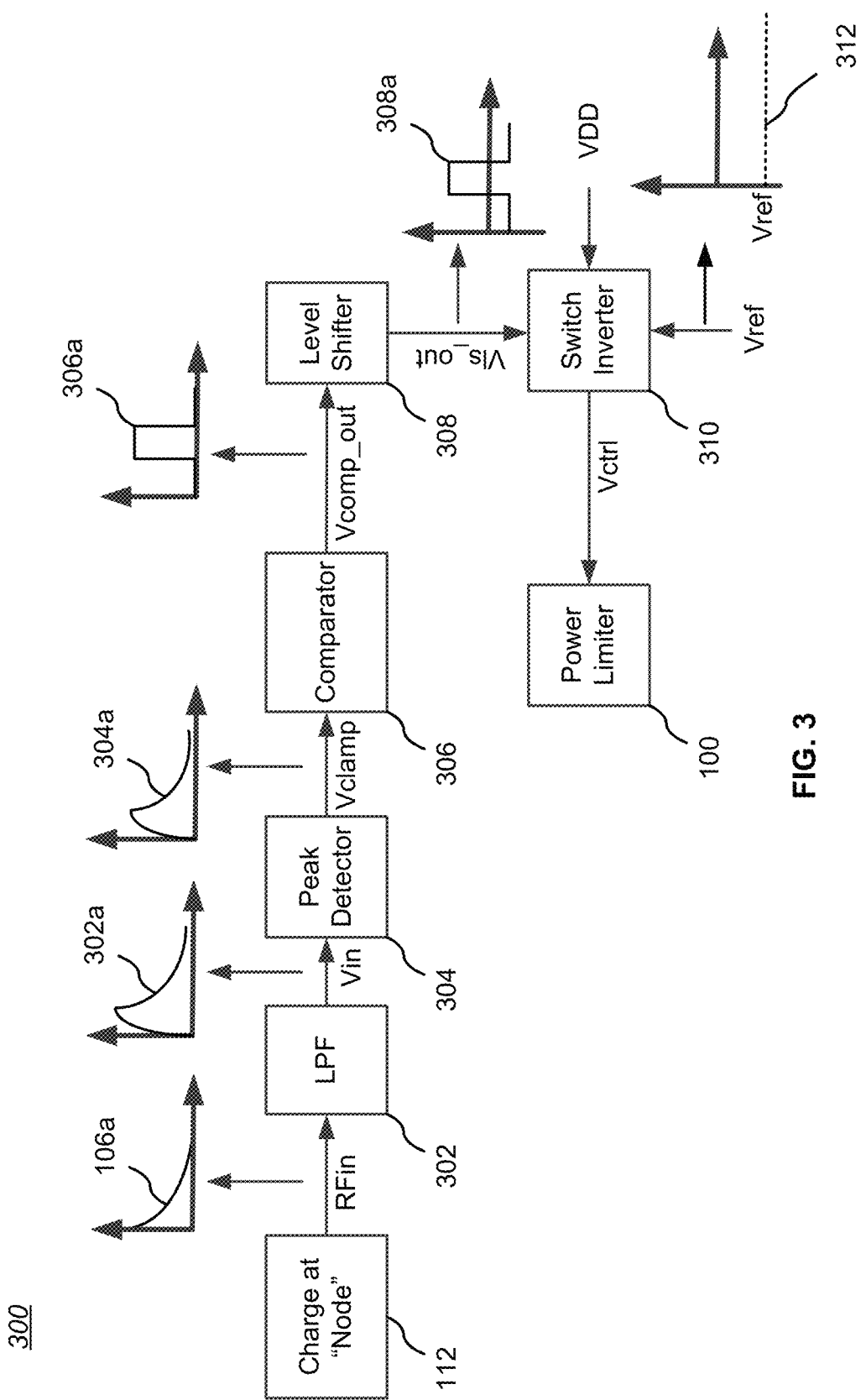
FIG. 3 is a block diagram of an externally powered (external to the illustrated circuit) embodiment of the DC transition protection circuit of FIG. 2.

FIG. 3 is a block diagram of an externally powered (external to the illustrated circuit) embodiment 300 of the DC transition protection circuit 110 of FIG. 2. A capacitor discharge event at node 112 (such as from an output signal RFin from the source 102) is applied to a low pass filter (LPF) 302 to filter out signal frequencies that can be handled by a conventional power limiter 100. In the illustrated embodiment, the LPF 302 filters out frequencies above about 1 MHz, but other filtering thresholds may be selected for particular applications; for example, a 9 KHz threshold may be useful in some test and measurement applications.

The output Vin of the LPF 302 corresponding to the capacitor discharge event shown in curve 106a is shown in the time (x-axis) versus voltage (y-axis) curve 302a. Vin is applied to a conventional analog peak detector 304. As is known in the art, an analog peak detector outputs a DC voltage proportional to the peak value of an applied AC signal and essentially smooths out the low frequency components of Vin. In the illustrated embodiment, the peak detector 304 detection output voltage Vclamp corresponding to Vin is shown in the time (x-axis) versus voltage (y-axis) curve 304a.

The detection output Vclamp of the peak detector 304 is applied to a conventional comparator 306 which compares the value of Vclamp to a reference value. In the illustrated embodiment, the comparator 306 output a comparison voltage Vcomp_out corresponding to Vclamp is shown in the time (x-axis) versus voltage (y-axis) curve 306a.

The square wave type nature of Vcomp_out is generally suitable for use as a control signal for a power limiter 100, allowing the power limiter 100 to be turned on briefly in order to shunt a capacitor discharge event at node 112 to circuit ground. In some cases, such as with a power limiter 100 of the type shown in U.S. patent application Ser. No. 13/841,490 cited above, the voltage of Vcomp_out may need to be level shifted in order to provide compatibility with the types of switching elements used within the power limiter 100. Accordingly, by way of example only, in the illustrated embodiment a conventional level shifter 308 coupled to the comparator 306 translates Vcomp_out into Vls_out. The level shifter 308 output voltage Vls_out corresponding to Vcomp_out is shown in the time (x-axis) versus voltage (y-axis) curve 308a. As shown, when used with the switch inverter 310 described below, Vls_out has a positive high voltage that can force the illustrated power limiter 100 into a low impedance (shunting) mode regardless of the value of the Vctrl signal normally applied to the power limiter 100. Vls_out also has a negative low voltage that is equal to or lower than the Vref signal, which, in conjunction with the switch inverter 310 described below, allows Vref to dominate control of the power limiter 100 in the absence of a capacitor discharge event. Note that in other embodiments, Vls_out may be coupled to directly activate the power limiter 100, and that the relative voltages for Vls_out and Vref may be different than shown or reversed in polarity depending on the implementing technology.

In the illustrated embodiment, a switch inverter 310 is coupled to the output of the level shifter 308 and to a system voltage source VDD; the output of the switch inverter 310 is coupled to the Vctrl input of the power limiter 100. In addition, the switch inverter 310 is coupled to a reference voltage Vref (<VDD) having an essentially constant value as shown in the time (x-axis) versus voltage (y-axis) curve 312. The switch inverter 310 is a signal switch that normally outputs Vref as the Vctrl signal to the power limiter 100. However, when a sufficiently large capacitor discharge event occurs at node 112 so as to generate Vls_out, and the value of Vls_out exceeds Vref, then VDD is output by the switch inverter 310 as the Vctrl signal to the power limiter 100, thereby forcing the illustrated power limiter 100 into a low impedance (shunting) mode.

Figure 4:
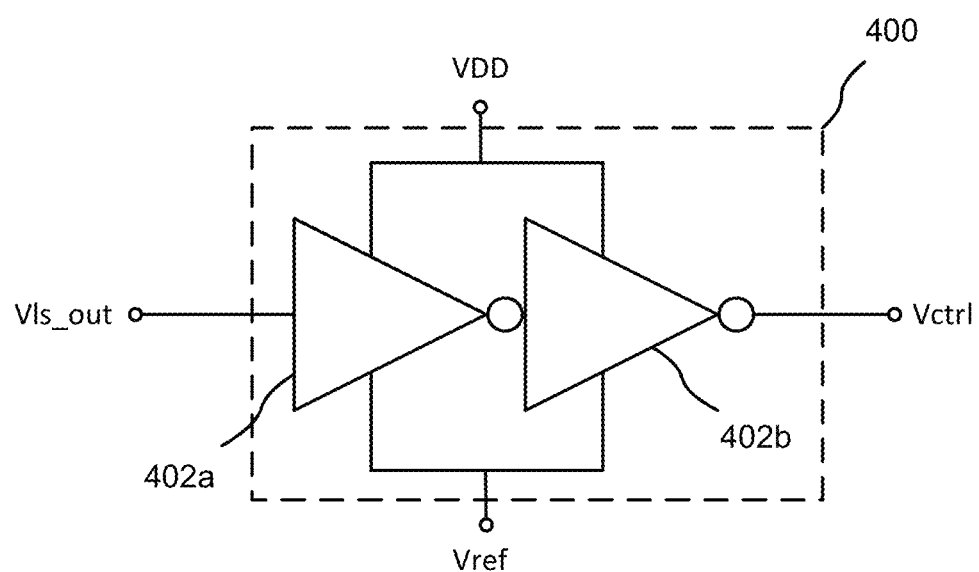
FIG. 4 shows one embodiment of the switch inverter shown in FIG. 3.

FIG. 4 shows one embodiment of the switch inverter 310 shown in FIG. 3, comprising a conventional non-inverting buffer circuit 400 having VDD as a power source and Vref applied to the "ground" input. As is known in the art, such a circuit may be implemented, for example, as a pair of cascaded CMOS inverters 402a, 402b. The output of the level shifter, Vls_out, is applied to the input of buffer circuit 400. In the illustrated configuration using cascaded CMOS inverters 402a, 402b, when Vls_out is larger than the switching threshold voltage of the inverters, the output Vctrl equals VDD; otherwise, the output Vctrl equals Vref. Accordingly, Vls_out is used as a switching signal rather than being applied directly to the power limiter 100. Advantages of the buffer circuit 400 shown in FIG. 4 include easily changing the input threshold voltage (via the P/N ratio of the inverters 402a, 402b) and making the control voltage (Vctrl) constant (i.e., either VDD or Vref) regardless of the amplitude of Vls_out. As mentioned above, in other embodiments, Vls_out may be coupled to directly activate the power limiter 100.

Figure 5:
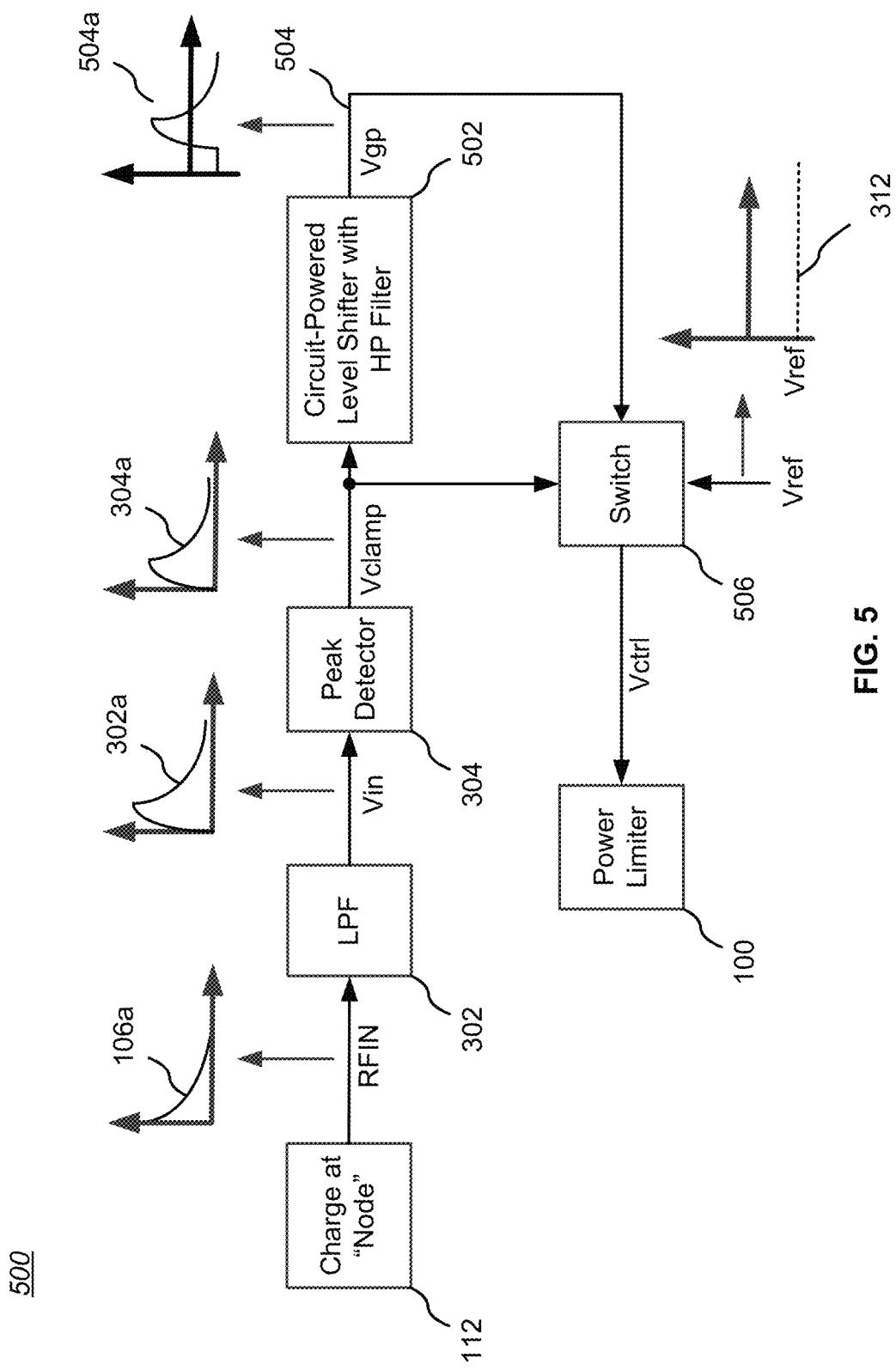
FIG. 5 is a block diagram of an internally powered embodiment of the DC transition protection circuit of FIG. 2.

FIG. 5 is a block diagram of an internally powered embodiment 500 of the DC transition protection circuit 110 of FIG. 2. An advantage of this embodiment is that it is powered by the input signal, and thus an external power supply is not required. As in FIG. 3, a capacitor discharge event at node 112, such as from an output signal RFin from the source 102, is applied to a low pass filter (LPF) 302 to filter out signal frequencies that can be handled by a conventional power limiter 100. In the illustrated embodiment, the LPF 302 filters out frequencies above about 1 MHz, but other filtering thresholds may be selected for particular applications, as noted above.

The output Vin of the LPF 302 corresponding to the capacitor discharge event shown in curve 106a is shown in the time (x-axis) versus voltage (y-axis) curve 302a. Vin is applied to a conventional analog peak detector 304. As in FIG. 3, the analog peak detector outputs a DC voltage proportional to the peak value of an applied AC signal and essentially smooths out the low frequency components of Vin. In the illustrated embodiment, the peak detector 304 detection output voltage Vclamp corresponding to Vin is shown in the time (x-axis) versus voltage (y-axis) curve 304a.

In the embodiment shown in FIG. 5, the detection output voltage Vclamp of the peak detector 304 is applied to a circuit-powered level shifter 502 that includes a high pass filter. In the illustrated embodiment, the circuit-powered level shifter 502 output Vgp corresponding to Vclamp is shown in the time (x-axis) versus voltage (y-axis) curve 504a. The function of the circuit-powered level shifter 502 is similar to the level shifter 308 of FIG. 3, the principal difference being that the power supply for the circuit-powered level shifter 502 is provided by Vin from the LPF 302, as described below in conjunction with FIG. 6.

The output Vgp of the circuit-powered level shifter 502 is applied to a signal switch 506 that functions similar to the switch inverter 310 of FIG. 3 by selectively controlling which of two input voltages, Vref or Vclamp, is applied to the Vctrl input of the power limiter 100, as described below in conjunction with FIG. 7.

Figure 6:
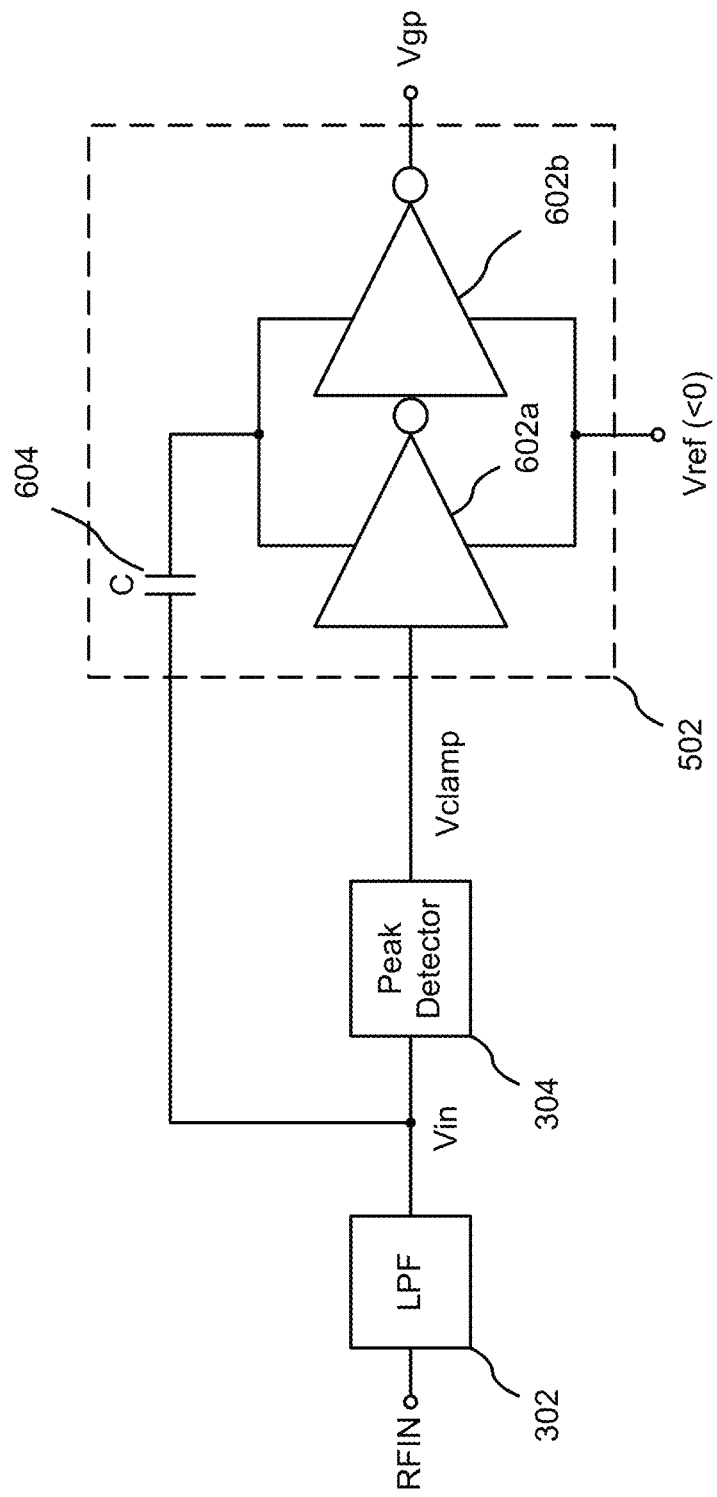
FIG. 6 is block and schematic diagram of an embodiment of the circuit-powered level shifter shown in FIG. 5.

FIG. 6 is block and schematic diagram of an embodiment of the circuit-powered level shifter 502 shown in FIG. 5. The LPF 302 and peak detector 304 function as described with respect to FIGS. 3 and 5. The output Vclamp of the peak detector 304 is applied as in input to the circuit-powered level shifter 502, which in this embodiment comprises a pair of inverters 602a, 602b. Power for the inverters 602a, 602b is provided by coupling Vin to the inverters through a capacitor 604, which filters out low frequency components of the Vin signal. The other input of each inverter 602a, 602b is coupled to Vref (<0 volts). The output Vgp of the circuit-powered level shifter 502 is a level-shifted version of the Vclamp input signal (see curve 504a in FIG. 5), and is coupled to the switch 506 shown in detail in FIG. 7. Note that, in an alternative embodiment, the level-shifter 502 may be externally powered.

Figure 7:
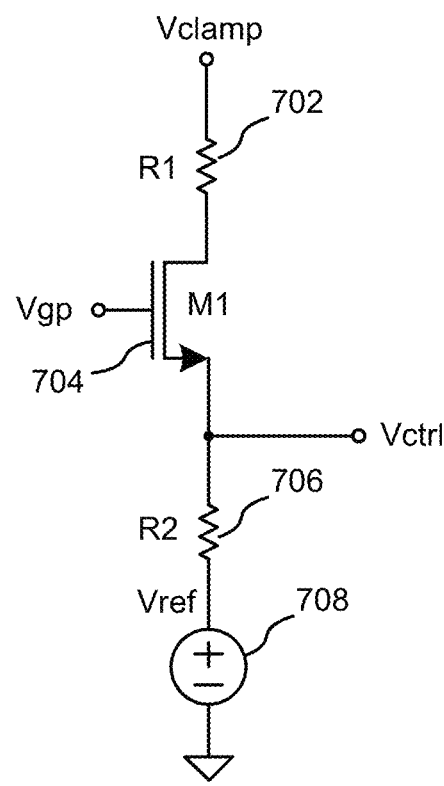
FIG. 7 is schematic diagram of the switch shown in FIG. 5.

FIG. 7 is schematic diagram of the switch 506 shown in FIG. 5. Vclamp is applied to a series of components comprising a resistor R1 702, a switch 704 (shown as an NMOS transistor M1), an output Vctrl, a resistor R2 706, a voltage reference source Vref 708, and ground. The switch M1 is coupled to and controlled by the output Vgp of the circuit-powered level shifter 502 shown in FIG. 5 and FIG. 6.

If the switch M1 is turned on by Vgp (meaning that a capacitor discharge event has occurred at node 112 resulting in Vgp being generated), then the output Vctrl is expressed by the following equation:

$$Vctrl=Vref+(R2/(R2+R1))*Vclamp$$

In this case, the value of Vctrl is sufficient to force the activation of the limiting function of the power limiter 100. Otherwise, switch M1 is off and Vctrl=Vref, and the power limiter 100 functions normally. The value of Vctrl can be adjusted by changing the ratio of resistors R1 and R2.

It should be appreciated that the switch inverter 310 of FIG. 3 and the switch 506 of FIG. 5 are useful for combining a capacitance discharge limiter in accordance with the present disclosure with an existing power limiter 100. However, in some applications it may be useful to separate the functionality of the capacitance discharge limiter from the power limiter. FIG. 8 is a block diagram of a capacitance discharge limiter embodying a switchless DC transition protection circuit 802. As in FIG. 2, shown are a power limiter 100 between a source 102 and a receiver 104, with a capacitor 106 situated between the source 102 and the power limiter 100. Also included is a switchless DC transition protection circuit 802, which is coupled to a reference voltage Vref and between the capacitor 106 and the power limiter 100 at a node 112.

Rather than coupling the DC transition protection circuit 802 through switching circuitry to the power limiter 100, the DC transition protection circuit 802 is coupled to the control input of a discharge circuit 804 (shown as the gate of an NMOS transistor M2 in this particular example) that can be selectively activated to discharge the capacitor 106 (for example, to circuit ground). The function of the DC transition protection circuit 802 is otherwise essentially the same as the circuits shown in FIG. 3 and FIG. 5. More particularly, a capacitor discharge event at node 112 will be sensed by the DC transition protection circuit 802, which will generate a transient control voltage for the discharge circuit 804 (rather than activating the power limiter 100). In the illustrated embodiment, the transient control voltage forces the discharge circuit 804 to a low impedance mode, which discharges the capacitor 106 (in the illustrated example, to circuit ground) in a very short period of time. The power limiter 100 handles limiting functions in a normal fashion independently of the DC transition protection circuit 802.

The DC transition protection circuit 802 may be configured internally similar to the circuit shown in FIG. 3 by including a low pass filter 302, a peak detector 304, a comparator 306, and, if needed, a level shifter 308. Alternatively, the DC transition protection circuit 802 may be configured internally similar to the circuit shown in FIG. 5 by including a low pass filter 302, a peak detector 304, and, if needed, a circuit-powered level shifter 502.

Figures 9A, 9B:
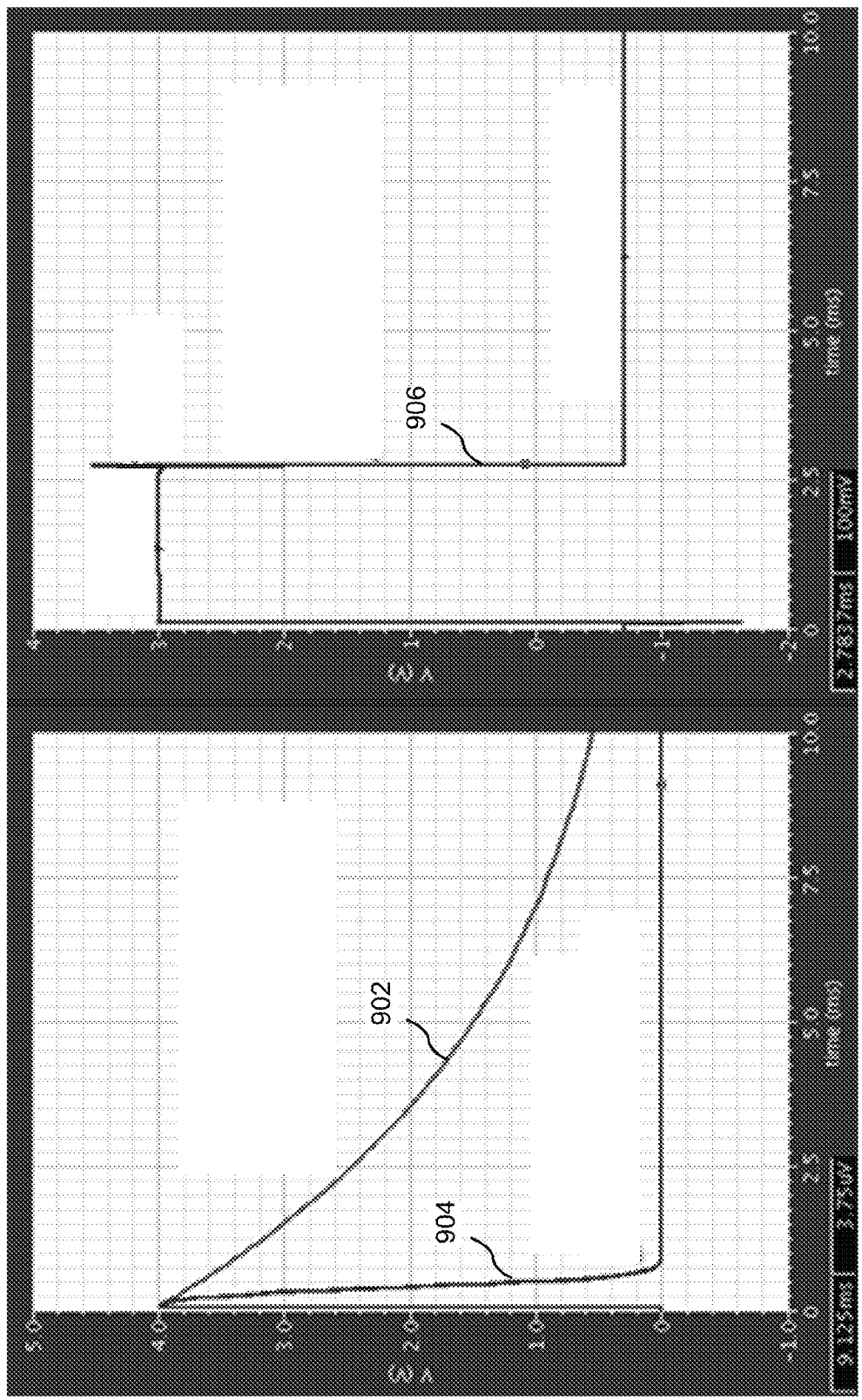
FIG. 9A is a graph of time (x-axis) versus voltage (y-axis) showing the results of simulating a particular embodiment of the capacitance discharge limiter embodiment shown in FIG. 3.
FIG. 9B is a graph of time (x-axis) versus voltage (y-axis) showing the Vctrl signal generated by the capacitance discharge limiter embodiment shown in FIG. 3 for the same test conditions applicable to FIG. 9A.

A capacitance discharge limiter in accordance with the present disclosure can provide rapid and significant protection from a capacitor discharge event. For example, FIG. 9A is a graph of time (x-axis) versus voltage (y-axis) showing the results of simulating a particular embodiment of the capacitance discharge limiter embodiment shown in FIG. 3. Curve 902 shows a classic capacitor discharge curve that occurs at the node 112 when the capacitance discharge limiter is disable or absent. Curve 904 shows the discharge curve that occurs at the node 112 when the capacitance discharge limiter is present and active. As can be seen, essentially all of the charge at the node 112 is discharged within a fraction of the time needed for natural decay.

FIG. 9B is a graph of time (x-axis) versus voltage (y-axis) showing the Vctrl signal generated by the capacitance discharge limiter embodiment shown in FIG. 3 for the same test conditions applicable to FIG. 9A. As can be seen, the capacitance discharge limiter reacts quickly to a capacitor discharge event to generate Vctrl 906 (positive in this example). Vctrl 906 enables the discharge circuitry for a sufficient time to discharge node 112 before disabling the discharge circuitry by returning to a quiescent state (negative in this example).

Figures 10A, 10B:
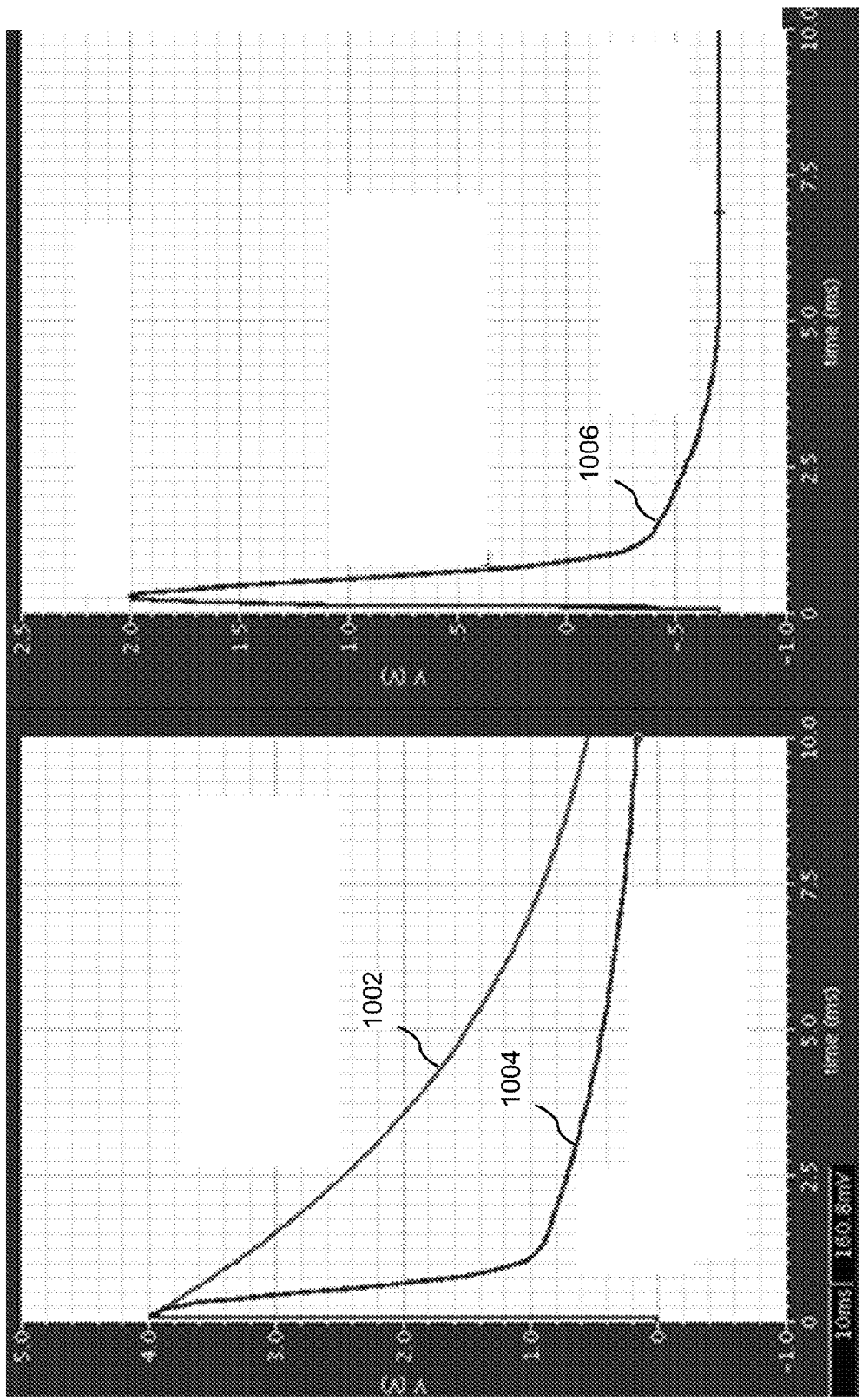
FIG. 10A is a graph of time (x-axis) versus voltage (y-axis) showing the results of simulating a particular embodiment of the capacitance discharge limiter embodiment shown in FIG. 5.

As another example, FIG. 10A is a graph of time (x-axis) versus voltage (y-axis) showing the results of simulating a particular embodiment of the capacitance discharge limiter embodiment shown in FIG. 5. Curve 1002 shows a classic capacitor discharge curve that occurs at the node 112 when the capacitance discharge limiter is disable or absent. Curve 1004 shows the discharge curve that occurs at the node 112 when the capacitance discharge limiter is present and active. As can be seen, the majority (here, about 75%) of the charge at the node 112 is dissipated within a fraction of the time needed for natural decay.

FIG. 10 B is a graph of time (x-axis) versus voltage (y-axis) showing the Vctrl signal generated by the capacitance discharge limiter embodiment shown in FIG. 5 for the same test conditions applicable to FIG. 10A. As can be seen, the capacitance discharge limiter reacts quickly to a capacitor discharge event to generate Vctrl 1006 (the positive in this example). Vctrl 1006 enables the discharge circuitry for a sufficient time to discharge node 112 before disabling the discharge circuitry by returning to a quiescent state (negative in this example).

Another aspect of the invention includes a method for rapidly detecting and discharging undesired capacitor charge, including the steps of:

STEP 1: filtering an input signal from a capacitor to pass only DC and low frequency voltages (typically less than about 1 MHz, including in particular from DC to about 9 KHz);

STEP 2: detecting peak values of the filtered input signal;

STEP 3: comparing the detected peak values of the filtered input signal against a reference voltage to generate a discharge circuit control signal; and STEP 4: applying the discharge circuit control signal to a discharge circuit (which may be a power limiter) coupled to the input signal and circuit ground, thereby activating the discharge circuit and discharging the capacitor.

Yet another aspect of the invention includes a method for rapidly detecting and discharging undesired capacitor charge, including the steps of:

STEP 1: filtering an input signal from a capacitor to pass only DC and low frequency voltages (typically less than about 1 MHz, including in particular from DC to about 9 KHz);

STEP 2: detecting peak values of the filtered input signal and generating a discharge circuit control signal in response to such detection; and STEP 3: applying the discharge circuit control signal to a discharge circuit (which may be a power limiter) coupled to the input signal and circuit ground, thereby activating the discharge circuit and discharging the capacitor.

Both of the above methods may include further steps, such as providing for voltage level shifting and a signal switching to selectively connect either a reference voltage or a generated control voltage derived from the input signal.

As should be readily apparent to one of ordinary skill in the art, various embodiments of the invention can be implemented to meet a wide variety of specifications. Thus, selection of suitable component values are a matter of design choice (so long at the frequencies of interest mentioned above can be handled). The switching and passive elements may be implemented in any suitable integrated circuit (IC) technology, including but not limited to MOSFET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:
1. A capacitance discharge limiter including:
(a) a discharge circuit coupled to a capacitor; and
(b) a DC transition protection circuit coupled to the capacitor and to the discharge circuit for detecting the existence of an excess DC or low frequency voltage potential caused by charge on the capacitor, and for regulating a control voltage to the discharge circuit so as to enable the discharge circuit to discharge the capacitor.

2. The capacitance discharge limiter of claim 1, wherein the low frequency voltage potential is less than about 1 MHz.

3. The capacitance discharge limiter of claim 1, wherein the discharge circuit includes a power limiter.

4. A capacitance discharge limiter including:
(a) discharge circuit means coupled to a capacitor; and
(b) DC transition protection means coupled to the capacitor and to the discharge circuit means for detecting the existence of an excess DC or low frequency voltage potential caused by charge on the capacitor, and for regulating a control voltage to the discharge circuit means so as to enable the discharge circuit means to discharge the capacitor.

5. The capacitance discharge limiter of claim 4, wherein the low frequency voltage potential is less than about 1 MHz.

6. The capacitance discharge limiter of claim 4, wherein the discharge circuit means includes a power limiter.

* * * * *